US012757782B2

(12) United States Patent
Choi et al.

(10) Patent No.: US 12,757,782 B2
(45) Date of Patent: Oct. 6, 2026

(54) SEMICONDUCTOR DEVICE

(71) Applicant: Samsung Electronics Co., Ltd., Suwon-si (KR)

(72) Inventors: Chulmin Choi, Suwon-si (KR); Nambin Kim, Suwon-si (KR); Samki Kim, Suwon-si (KR); Taehun Kim, Suwon-si (KR); Seungjae Baik, Suwon-si (KR); Jaeduk Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 337 days.

(21) Appl. No.: 18/640,201

(22) Filed: Apr. 19, 2024

(65) Prior Publication Data

US 2024/0395649 A1 Nov. 28, 2024

(30) Foreign Application Priority Data

May 25, 2023 (KR) ........................ 10-2023-0067833

(51) Int. Cl.

| | |
|---|---|
| ***H10W 74/10*** | (2026.01) |
| ***H10B 12/00*** | (2023.01) |
| ***H10W 20/42*** | (2026.01) |
| ***H10W 74/43*** | (2026.01) |

(52) U.S. Cl.

CPC ........ *H10W 74/137* (2026.01); *H10B 12/485* (2023.02); *H10B 12/488* (2023.02); *H10W 20/42* (2026.01); *H10W 74/43* (2026.01)

(58) Field of Classification Search

CPC .... H10B 12/485; H10B 12/488; H10B 43/27; H10B 43/40

See application file for complete search history.

(56) References Cited

U.S. PATENT DOCUMENTS

| | | | | |
|---|---|---|---|---|
| 9,991,281 | B2 | 6/2018 | Yun et al. | |
| 10,468,413 | B2 | 11/2019 | Takuma et al. | |
| 11,133,317 | B2 | 9/2021 | Lee et al. | |
| 2015/0155163 | A1 * | 6/2015 | Kim | H10P 14/6336 257/296 |
| 2020/0286913 | A1 * | 9/2020 | Noguchi | H10B 43/27 |

(Continued)

FOREIGN PATENT DOCUMENTS

| | | | |
|---|---|---|---|
| CN | 111162085 | A | 5/2020 |
| CN | 111244101 | A | 6/2020 |

(Continued)

*Primary Examiner* — Evren Seven

(74) *Attorney, Agent, or Firm* — Harness, Dickey & Pierce, P.L.C.

(57) ABSTRACT

Provided is a semiconductor device including a semiconductor substrate, a gate stack including a plurality of gate layers and a plurality of insulation layers alternately stacked on the semiconductor substrate, a plurality of first channel structures penetrating through the gate stack and extending in a vertical direction, a word line cut penetrating through the gate stack and extending in the vertical direction, a passivation layer disposed on the gate stack, and a string select line stack disposed on the passivation layer, wherein the passivation layer includes a first passivation layer containing a passivation element and a second passivation layer having a smaller content of the passivation element than the first passivation layer.

20 Claims, 14 Drawing Sheets

(56) References Cited

U.S. PATENT DOCUMENTS

| | | | | |
|---|---|---|---|---|
| 2021/0408044 | A1 | 12/2021 | Chiang et al. | |
| 2022/0037352 | A1 | 2/2022 | Zhang et al. | |
| 2022/0139952 | A1 * | 5/2022 | Kim | G11C 5/04 257/314 |
| 2022/0359559 | A1 | 11/2022 | Jang | |
| 2023/0180468 | A1 * | 6/2023 | Lee | H10B 12/50 |

FOREIGN PATENT DOCUMENTS

| | | | | | |
|---|---|---|---|---|---|
| CN | 113658921 | A | * | 11/2021 | H10W 74/43 |
| KR | 10-2023-0002161 | A | | 1/2023 | |

* cited by examiner

A-A'

SEMICONDUCTOR DEVICE

CROSS-REFERENCE TO RELATED APPLICATIONS

This application is based on and claims priority under 35 U.S.C. § 119 to Korean Patent Application No. 10-2023-0067833, filed on May 25, 2023, in the Korean Intellectual Property Office, the disclosure of which is incorporated by reference herein in its entirety.

BACKGROUND

The inventive concepts relate to a semiconductor device, and more particularly, to a semiconductor device including a non-volatile vertical memory device.

In an electronic system requiring data storage, a semiconductor device capable of storing high-capacity data is demanded, and thus, a method of increasing the data storage capacity of a semiconductor device is being studied. For example, as a method of increasing the data storage capacity of a semiconductor device, a memory device including a vertical memory device having 3-dimensionally arranged memory cells instead of 2-dimensionally arranged memory cells has been proposed.

SUMMARY

Some example embodiments provide a semiconductor device in which a passivation layer, which includes a passivation element disposed between a gate stack and a string select line stack. In some example embodiments, the passivation element is hydrogen, and the passivation layer is rich in hydrogen. In other example embodiments, the passivation element is deuterium, and the passivation layer is rich in deuterium. In other example embodiments, the passivation layer includes a combination of hydrogen and deuterium. In at least one example embodiment, a passivation layer including an effective amount of the passivation element is considered to be rich in that element.

According to an aspect of an example embodiment, there is provided a semiconductor device including a semiconductor substrate, a gate stack including a plurality of gate layers and a plurality of insulation layers alternately stacked on the semiconductor substrate, a plurality of first channel structures penetrating through the gate stack and extending in a vertical direction, a word line cut penetrating through the gate stack and extending in the vertical direction, a passivation layer disposed on the gate stack, and a string select line stack disposed on the passivation layer, wherein the passivation layer includes a first passivation layer containing a passivation element and a second passivation layer having a smaller content of the passivation element than the first passivation layer.

According to another aspect of an example embodiment, there is provided a semiconductor device including a semiconductor substrate, a gate stack including a plurality of gate layers and a plurality of insulation layers alternately stacked on the semiconductor substrate, a plurality of first channel structures penetrating through the gate stack and extending in a vertical direction, a word line cut penetrating through the gate stack and extending in the vertical direction, a passivation layer disposed on the gate stack, a string select line stack disposed on the passivation layer, a plurality of second channel structures penetrating through the string select line stack and extending in the vertical direction, and connection vias configured to electrically interconnect the plurality of first channel structures and the plurality of second channel structures, wherein the passivation layer includes a first passivation layer containing a passivation element including at least one element of hydrogen or deuterium and a second passivation layer having a smaller content of the passivation element than the first passivation layer.

According to another aspect of an example embodiment, there is provided an electronic system including a main substrate, a semiconductor device on the main substrate, and a controller electrically connected to the semiconductor device on the main substrate, wherein the semiconductor device includes a semiconductor substrate, a gate stack including a plurality of gate layers and a plurality of insulation layers alternately stacked on the semiconductor substrate, a plurality of first channel structures penetrating through the gate stack and extending in a vertical direction, a word line cut penetrating through the gate stack and extending in the vertical direction, a passivation layer disposed on the gate stack, a string select line stack disposed on the passivation layer, and a plurality of second channel structures penetrating through the string select line stack, extending in the vertical direction, and arranged to be offset from the plurality of corresponding first channel structures, and the passivation layer includes a first passivation layer containing a passivation element including at least one element of hydrogen or deuterium and a second passivation layer having a smaller content of the passivation element than the first passivation layer.

BRIEF DESCRIPTION OF THE DRAWINGS

Various example embodiments will be more clearly understood from the following detailed description taken in conjunction with the accompanying drawings in which.

DETAILED DESCRIPTION OF THE EMBODIMENTS

Figure 1:
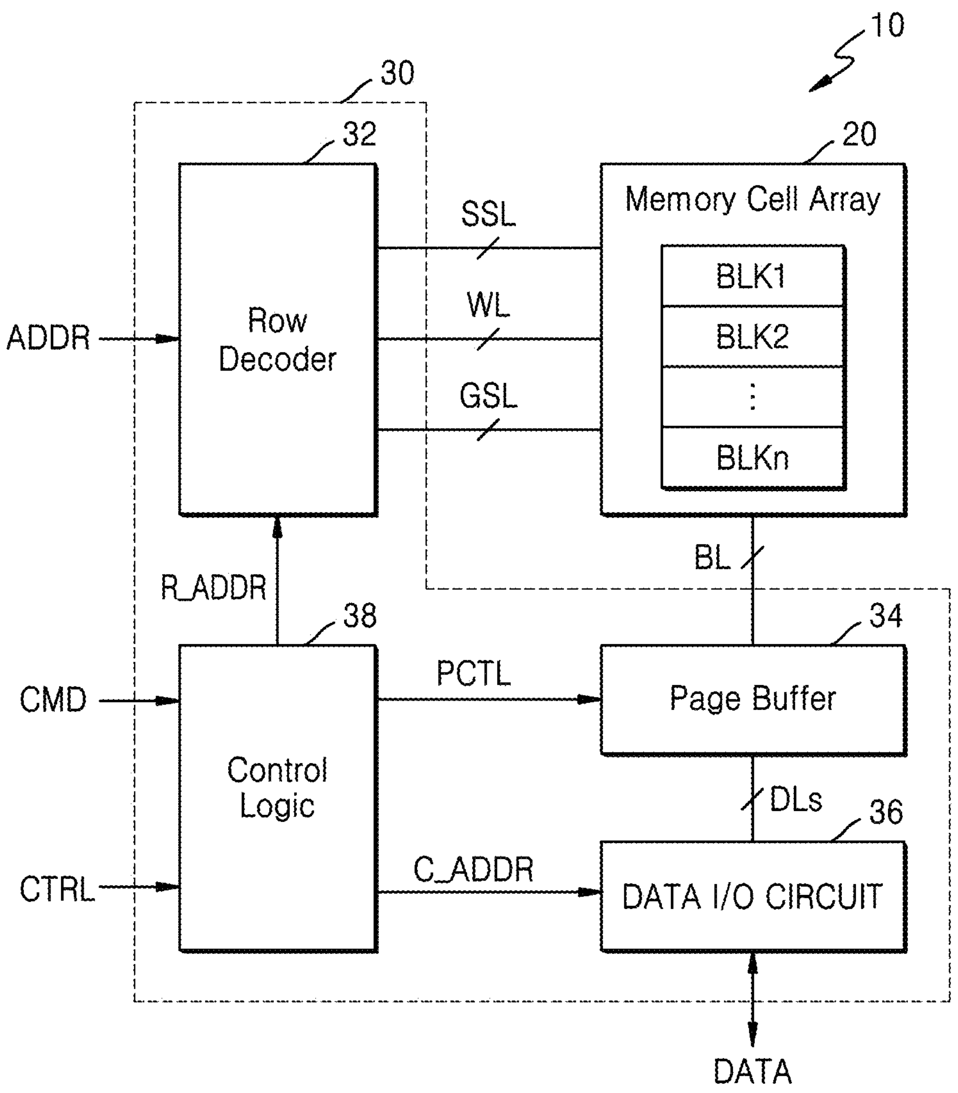
FIG. 1 is a block diagram showing a semiconductor device according to an example embodiment.

FIG. 1 is a block diagram showing a semiconductor device according to an example embodiment.

Referring to FIG. 1, a semiconductor device 10 may include a memory cell array 20 and a peripheral circuit 30.

The memory cell array 20 may include a plurality of memory cell blocks BLK1, BLK2, . . . , and BLKn. The memory cell blocks BLK1, BLK2, . . . , and BLKn may each include a plurality of memory cells. The memory cell blocks BLK1, BLK2, . . . , and BLKn may be connected to the peripheral circuit 30 through a bit line BL, a word line WL, a string select line SSL, and a ground select line GSL.

The memory cell array 20 may be connected to a page buffer 34 through the bit line B, and may be connected to the row decoder 32 through the word line WL, the string select line SSL, and the ground select line GSL. In the memory cell array 20, the memory cells included in each of the memory cell blocks BLK1, BLK2, . . . , and BLKn may each be a flash memory cell. The memory cell array 20 may include a 3-dimensional memory cell array. The 3-dimensional memory cell array may include a plurality of NAND strings, and the plurality of NAND strings may each include a plurality of memory cells connected to a plurality of word lines WL vertically stacked.

The peripheral circuit 30 may include a row decoder 32, a page buffer 34, a data input/output circuit 36, and a control logic 38. Although not shown, the peripheral circuit 30 may further include various circuits like a voltage generating circuit for generating various voltages needed for the operation of the semiconductor device 10, an error correction circuit for correcting errors in data read from the memory cell array 20, and an input/output interface.

The peripheral circuit 30 may receive an address ADDR, a command CMD, and a control signal CTRL from a device outside the semiconductor device 10 and may transmit and receive data DATA to and from the device outside the semiconductor device 10. The configuration of the peripheral circuit 30 is described below in detail.

The row decoder 32 may select at least one of the memory cell blocks BLK1, BLK2, . . . , and BLKn in response to an address ADDR from the outside and select the word line WL, the string select line SSL, and the ground select line GSL corresponding to a selected memory cell block. The row decoder 32 may transmit a voltage for performing a memory operation to the word line WL corresponding to the selected memory cell block.

The page buffer 34 may be connected to the memory cell array 20 through the bit line BL. The page buffer 34 may operate as a write driver during a program operation and apply a voltage according to the data DATA to be stored in the memory cell array 20 to the bit line BL and may operate as a sense amplifier during a read operation and sense the data DATA stored in the memory cell array 20. The page buffer 34 may operate according to a control signal PCTL provided from the control logic 38.

The data input/output circuit 36 may be connected to the page buffer 34 through data lines DLs. During a program operation, the data input/output circuit 36 may receive the data DATA from a memory controller (not shown) and provide the data DATA to be programmed to the page buffer 34 based on a column address C_ADDR provided from the control logic 38. The data input/output circuit 36 may provide the data DATA to be read. which is stored in the page buffer 34, to the memory controller based on the column address C_ADDR provided from the control logic 38 during a read operation. The data input/output circuit 36 may transmit an address or a command input thereto to the control logic 38 or the row decoder 32.

The control logic 38 may receive a command CMD and a control signal CTRL from the memory controller. The control logic 38 may provide a row address R_ADDR to the row decoder 32 and provide the column address C_ADDR to the data input/output circuit 36. The control logic 38 may generate various internal control signals used in the semiconductor device 10 in response to the control signal CTRL. For example, the control logic 38 may adjust the level of a voltage provided to the word line WL and the bit line BL when a memory operation like a program operation or an erase operation is performed.

Figure 2:
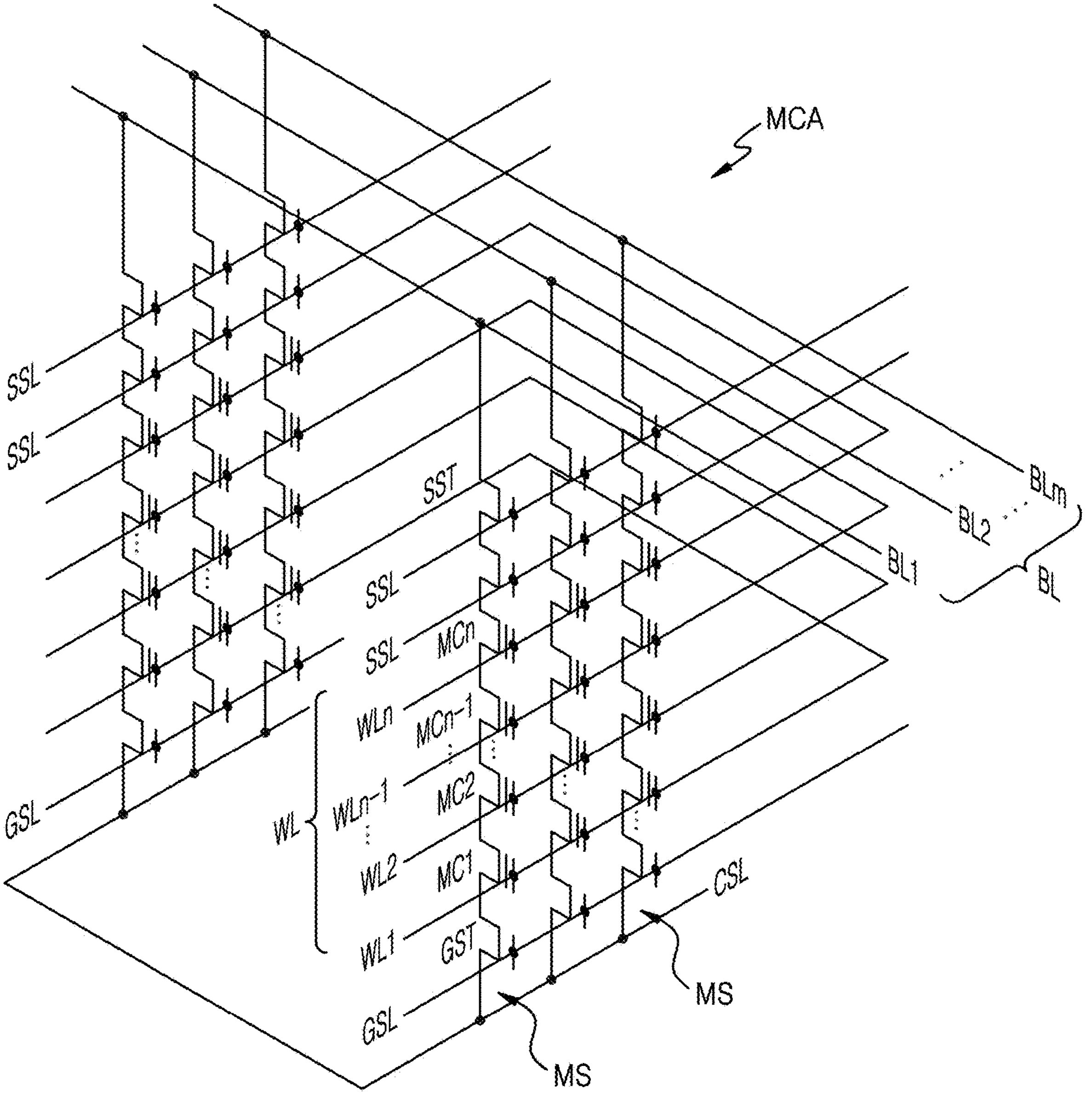
FIG. 2 is an equivalent circuit diagram of a memory cell array of a semiconductor device according to an example embodiment.

FIG. 2 is an equivalent circuit diagram of a memory cell array of a semiconductor device according to an example embodiment.

Referring to FIG. 2, an equivalent circuit diagram of a vertical NAND flash memory device having a vertical channel structure is shown.

A memory cell array MCA may include a plurality of memory cell strings MS. The memory cell array MCA may include a plurality of bit lines BL, a plurality of word lines WL, at least one string select line SSL, at least one ground select line GSL, and a common source line CSL.

A plurality of memory cell strings MS may be formed between the plurality of bit lines BL and the common source line CSL. Although FIG. 2 shows a case in which the memory cell strings MS each include two string select lines SSL, the example embodiment is not limited thereto. For example, the memory cell strings MS may each include one string select line SSL.

The memory cell strings MS may each include the string select transistor SST, the ground select transistor GST, and a plurality of memory cell transistors MC1, MC2, . . . , MCn−1, and MCn. A drain region of the string select transistor SST may be connected to the bit lines BL, and a source region of the ground select transistor GST may be connected to the common source line CSL. The common source line CSL may be a region in which source regions of a plurality of ground select transistors GST are connected in common.

The string select transistor SST may be connected to the string select line SSL, and the ground select transistor GST may be connected to the ground select line GSL. The memory cell transistors MC1, MC2, . . . , MCn−1, and MCn may be connected to the word lines WL, respectively.

Figure 3:
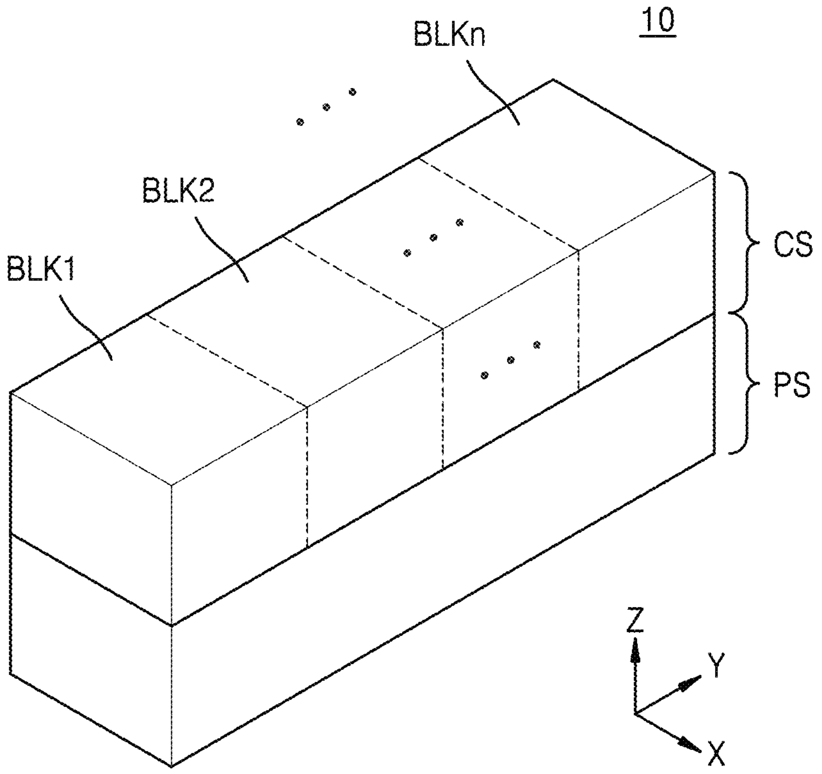
FIG. 3 is a schematic perspective view of a semiconductor device according to an example embodiment.

FIG. 3 is a schematic perspective view of a semiconductor device according to an example embodiment.

Referring to FIG. 3, the semiconductor device 10 may include a memory cell array structure CS and a peripheral circuit structure PS that overlap each other in a vertical direction.

The memory cell array structure CS may include the memory cell array 20 described above with reference to FIG. 1. The peripheral circuit structure PS may include the peripheral circuit 30 described above with reference to FIG. 1.

The memory cell array structure CS may include a plurality of tiles. The plurality of tiles may each include a plurality of memory cell blocks BLK1, BLK2, . . . , and BLKn. The memory cell blocks BLK1, BLK2, . . . , and BLKn may each include 3-dimensionally arranged memory cells.

According to some example embodiments, two tiles may constitute one mat, but various example embodiments are not limited thereto. For example, the memory cell array 20 described above with reference to FIG. 1 may include a plurality of mats.

Figure 4:
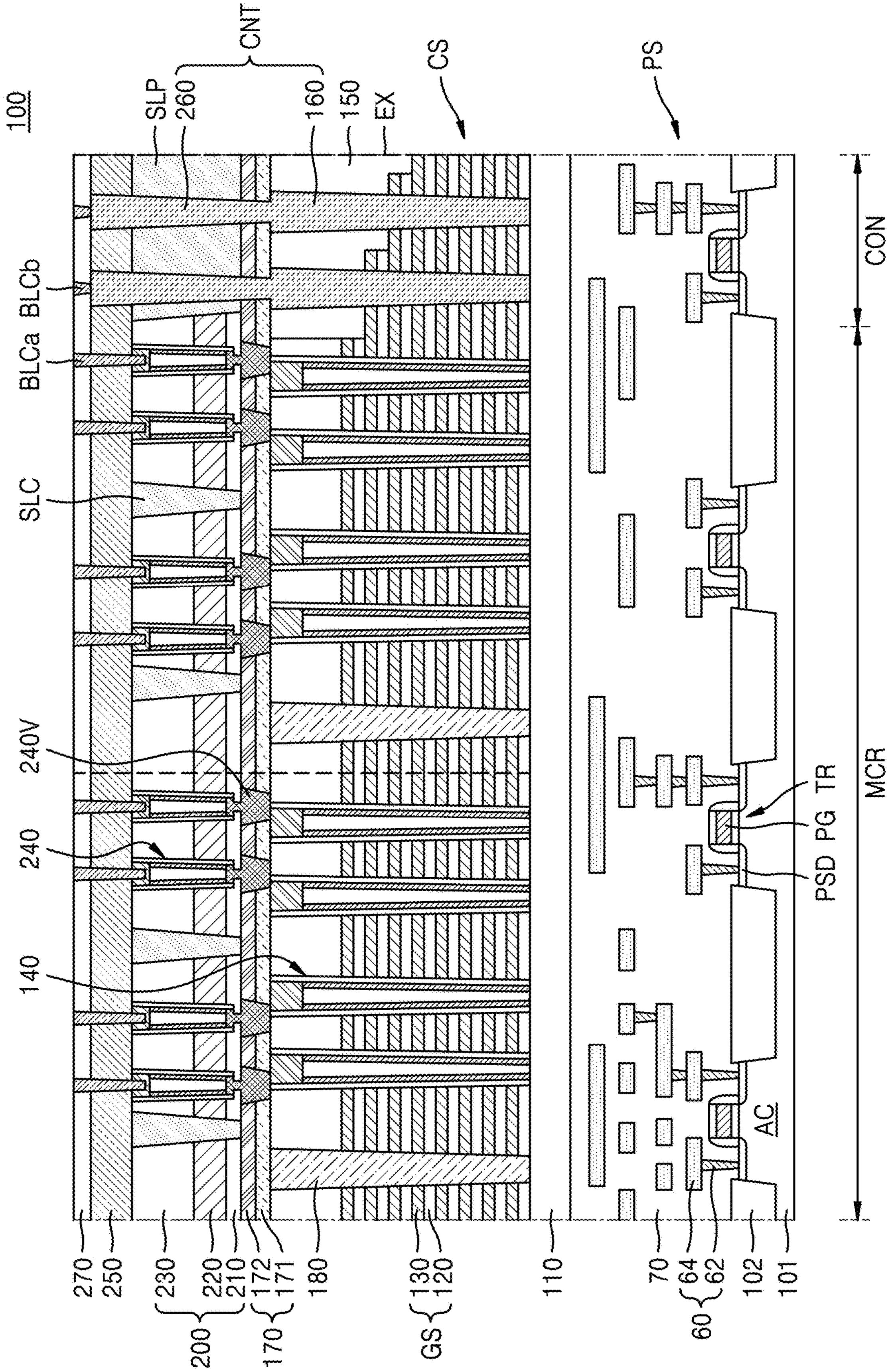
FIG. 4 is a cross-sectional view of a semiconductor device according to an example embodiment.

FIG. 4 is a cross-sectional view of a semiconductor device according to an example embodiment.

Figure 5:
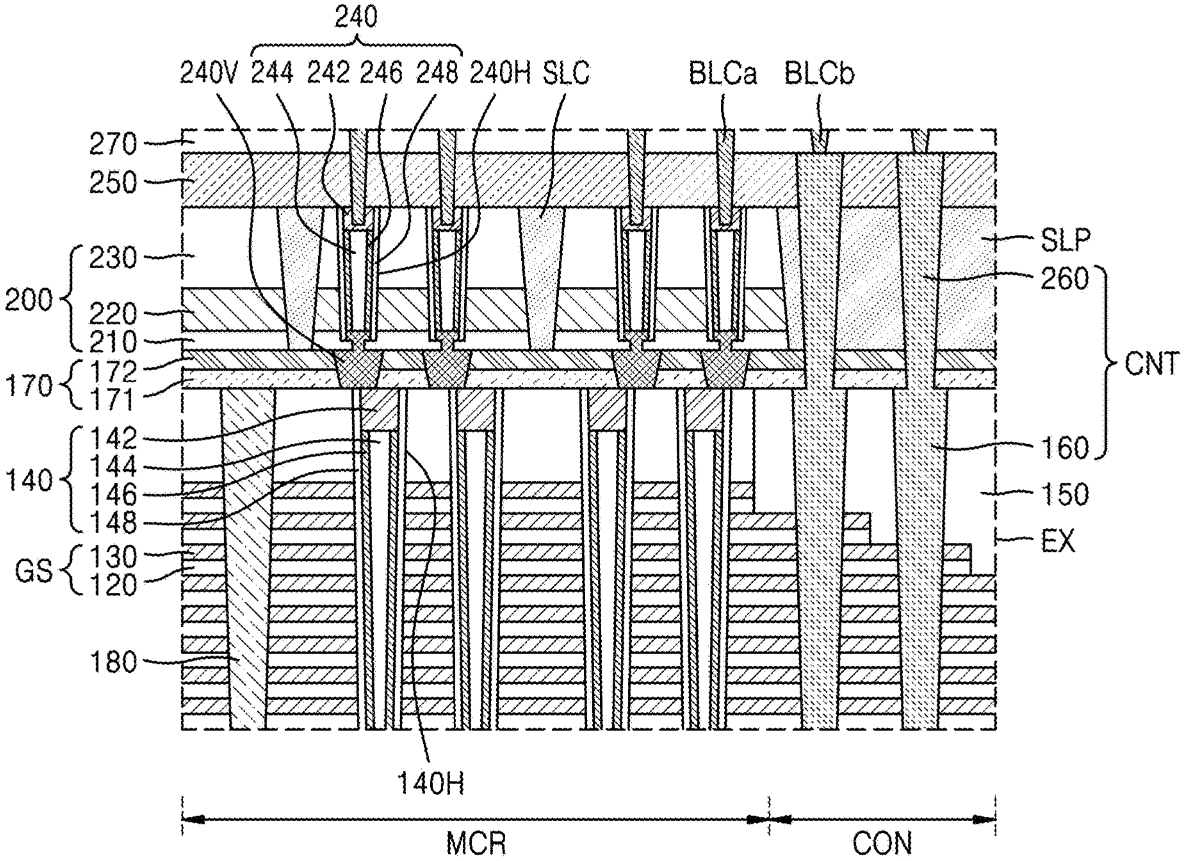
FIG. 5 is an enlarged cross-sectional view of a portion EX of FIG. 4.

FIG. 5 is an enlarged cross-sectional view of a portion EX of FIG. 4.

Referring to FIGS. 4 and 5, a semiconductor device 100 may include the peripheral circuit structure PS and the memory cell array structure CS disposed on the peripheral circuit structure PS.

The peripheral circuit structure PS may include a lower substrate 101, a plurality of transistors TR arranged on the lower substrate 101, and a wiring structure 60.

The lower substrate 101 may include a semiconductor substrate. The lower substrate 101 may include, for example, Si, Ge, or SiGe. An active region AC may be defined on the lower substrate 101 by a device isolation layer 102.

The plurality of transistors TR may be formed on the active region AC. The plurality of transistors TR may each include a gate PG and a plurality of ion implantation regions PSD. The plurality of ion implantation regions PSD may be formed in the active region AC on both sides of the gate PG. The plurality of ion implantation regions PSD may each constitute a source region or a drain region of a transistor TR.

The wiring structure 60 may include a plurality of contacts 62 and a plurality of wiring layers 64. The plurality of wiring layers 64 may have a multi-layered structure including a plurality of layers arranged at different vertical levels. At least some of the plurality of wiring layers 64 may be configured to be electrically connected to the transistors TR. The plurality of contacts 62 may be configured to interconnect some selected from among the plurality of transistors TR and some selected from among the plurality of wiring layers 64.

An interlayer insulation layer 70 surrounding the plurality of transistors TR and the wiring structure 60 may be disposed on the lower substrate 101. The interlayer insulation layer 70 may include a silicon oxide layer, a silicon nitride layer, a SiON layer, a SiOCN layer, or a combination thereof.

The cell array structure CS may be disposed on the peripheral circuit structure PS. The cell array structure CS may include a cell array region MCR and a connection region CON.

An upper substrate 110 may include a semiconductor substrate. The upper substrate 110 may include, for example, a group IV semiconductor, a group III-V compound semiconductor, or a group II-VI oxide semiconductor.

The gate stack GS may be disposed on the upper substrate 110. The gate stack GS may extend parallel to the top surface of the upper substrate 110. The gate stack GS may include a plurality of gate layers 130 and a plurality of insulation layers 120. The plurality of gate layers 130 and the plurality of insulation layers 120 may be alternately stacked on the upper substrate 110 in the vertical direction.

A gate layer 130 may include a conductive layer (not shown) and an insulation liner (not shown) surrounding the conductive layer. The conductive layer may include, for example, a metal such as tungsten, a metal silicide such as tungsten silicide, doped polysilicon, or a combination thereof. The insulation liner may include, for example, a high-k material such as aluminum oxide.

The gate layer 130 may correspond to the ground select line GSL and the word line WL constituting a memory cell string MS described with reference to FIG. 2. For example, the lowermost gate layer 130 may function as the ground select line GSL and the remaining gate layers 130 may function as the word lines WL.

A plurality of first channel structures 140 may penetrate through the gate stack GS from the top surface of the upper substrate 110 and extend in the vertical direction, in the cell array region MCR. The plurality of first channel structures 140 may be spaced apart from one another at certain intervals in a first horizontal direction and a second horizontal direction. The plurality of first channel structures 140 may be arranged in a zigzag shape or staggered shape.

The plurality of first channel structures 140 may be formed inside a first channel hole 140H. The plurality of first channel structures 140 may each include a first conductive plug 142, a first filling insulation layer 144, a first channel layer 146, and a first gate insulation layer 148. The first gate insulation layer 148 and the first channel layer 146 may be sequentially arranged on the sidewall of the first channel hole 140H. The first filling insulation layer 144 filling the remaining space of the first channel hole 140H may be disposed on the first channel layer 146. The first conductive plug 142 may be disposed above the first channel hole 140H to contact the first channel layer 146 and to block the top of the first channel hole 140H.

The first gate insulation layer 148 may include a tunneling dielectric layer (not shown), a charge storage layer (not shown), and a blocking dielectric layer (not shown) sequentially arranged on the outer wall of the first channel layer 146. The tunneling dielectric layer may include silicon oxide, hafnium oxide, aluminum oxide, zirconium oxide, tantalum oxide, etc. The charge storage layer is a region in which electrons that passed through the tunneling dielectric layer from the first channel layer 146 may be stored and may include silicon nitride, boron nitride, silicon boron nitride, or polysilicon doped with impurities. The blocking dielectric layer may include silicon oxide, silicon nitride, or a metal oxide having a higher permittivity than silicon oxide.

A plurality of word line cuts 180 may extend in the second horizontal direction on the upper substrate 110. A word line cut 180 may penetrate through the gate stack GS from the upper substrate 110 and extend in the vertical direction. According to an example embodiment, the word line cut 180 may have a tapered shape in which a horizontal width thereof increases in a direction away from the top surface of the upper substrate 110. The gate stack GS disposed between a pair of word line cuts 180 may constitute one block, and the pair of word line cuts 180 may limit the width of the gate stack GS in the first horizontal direction. The word line cut 180 may include an insulation spacer (not shown) and an insulation separation layer (not shown). That is, the word line cut 180 may include an insulation structure. According to some example embodiments, the level of the top of the plurality of first channel structures 140 and the level of the top of the word line cut 180 may be substantially the same.

A passivation layer 170 may be disposed on the gate stack GS. The passivation layer 170 may include a first passivation layer 171 and a second passivation layer 172. The first passivation layer 171 and the second passivation layer 172 may be formed in a stacked structure. For example, the first passivation layer 171 may be stacked on the gate stack GS in a horizontal direction and the second passivation layer 172 may be stacked on the first passivation layer 171 in the horizontal direction. In this case, the first passivation layer 171 and the second passivation layer 172 may each include silicon nitride (e.g., SiN).

Thicknesses of the first passivation layer 171 and the second passivation layer 172 in the vertical direction may be different from each other. For example, the thickness of the first passivation layer 171 in the vertical direction may be greater than the thickness of the second passivation layer 172 in the vertical direction. However, the example embodiment is not limited thereto, and the thicknesses of the first passivation layer 171 and the second passivation layer 172 in the vertical direction may be substantially the same or the thickness of the second passivation layer 172 in the vertical direction may be greater than the thickness of the first passivation layer 171 in the vertical direction.

The first passivation layer 171 may include a passivation element. In this case, the passivation element may be hydrogen and/or deuterium. For example, the first passivation layer 171 may include hydrogen, deuterium, or a combination thereof.

The second passivation layer 172 may also include a passivation element. However, the second passivation layer 172 may have a relatively small content of a passivation elements as compared to the first passivation layer 171. The first passivation layer 171 may be formed as a hydrogen (and/or deuterium)-rich layer, and the second passivation layer 172 may be formed as a hydrogen (and/or deuterium)-poor (rich) layer. In this case, the first passivation layer 171 may be a hydrogen (and/or deuterium)-rich layer supplying hydrogen (and/or deuterium) to the cell array structure CS. The second passivation layer 172 may be a hydrogen (and/or deuterium)-pour layer blocking hydrogen (and/or deuterium) supplied to the cell array structure CS.

By forming the first passivation layer 171 as a hydrogen (and/or deuterium)-rich layer, hydrogen (and/or deuterium) may be supplied to the cell array structure CS. In detail, hydrogen (and/or deuterium) may be supplied to the first channel layer 146. Therefore, cell characteristics of the semiconductor device 100 may be improved by increasing the passivation effect of the cell array structure CS.

According to a comparative example, as the number of stages of a gate stack increases, the length of a channel layer to supply hydrogen increases, and thus, hydrogen needs to be additionally supplied the channel layer. According to the example embodiment, by forming the first passivation layer 171 as a hydrogen (and/or deuterium)-rich layer, it is possible to additionally supply hydrogen (and/or deuterium) to the first channel layer 146.

A string select line stack 200 may be disposed on the passivation layer 170. The string select line stack 200 may include a first string select line insulation layer 210, a string select line gate layer 220, and a second string select line insulation layer 230. The first string select line insulation layer 210, the string select line gate layer 220, and the second string select line insulation layer 230 may be sequentially stacked in the vertical direction from the top surface of the passivation layer 170.

The first string select line insulation layer 210 and the second string select line insulation layer 230 may each include, for example, silicon oxide, silicon nitride, silicon oxynitride, or a combination thereof.

The string select line gate layer 220 may include a string select line filling conductive layer (not shown) and a string select line insulation liner (not shown) surrounding the string select line filling conductive layer. The string select line gate layer 220 may include a polysilicon monolayer structure, an oxide/polysilicon stack structure, or an oxide/metal stack structure, but the example embodiment is not limited thereto.

A plurality of second channel structures 240 may be arranged on the passivation layer 170 and may extend through the string select line stack 200 in the vertical direction. The plurality of second channel structures 240 may be spaced apart from one another at certain intervals in the first horizontal direction and the second horizontal direction. The plurality of second channel structures 240 may be arranged in a zigzag shape or staggered shape.

The plurality of second channel structures 240 may be formed inside a second channel hole 240H. The plurality of second channel structures 240 may each include a second conductive plug 242, a second filling insulation layer 244, a second channel layer 246, and a second gate insulation layer 248. Components of a second channel structure 240 may be similar to respective corresponding components of a first channel structure 140.

According to an example embodiment, the central axes of the plurality of first channel structures 140 and the central axes of the plurality of second channel structures 240 may be arranged to be offset from each other.

A connection via 240V may penetrate through the passivation layer 170 and may be provided between the gate stack GS and the string select line stack 200. The top surface of the connection via 240V may contact the second channel structure 240, and the bottom surface of the connection via 240V may contact the first channel structure 140. Therefore, even when the central axis of the first channel structure 140 and the central axis of the second channel structure 240 corresponding thereto are arranged to be offset from each other, through connecting vias 240V, the plurality of first channel structures 140 and the plurality of second channel structures 240 may be electrically connected to each other.

A string select line cut SLC may penetrate through the string select line stack 200 and extend in the vertical direction in the cell array region MCR. The string select line cut SLC may include an insulation material. According to an example embodiment, the string select line cut SLC may have a tapered shape in which a horizontal width thereof increases in a direction away from the top surface of the upper substrate 110.

A first upper insulation layer 250 may be disposed on the string select line stack 200. The first upper insulation layer 250 may include, for example, silicon oxide, but the example embodiment is not limited thereto. A second upper insulation layer 270 may be disposed on the first upper insulation layer 250.

A plurality of first bit line contact plugs BLCa may be connected to the second channel structure 240 and may penetrate through the first upper insulation layer 250 and the second upper insulation layer 270 in the vertical direction. The second channel structure 240 may be connected to bit lines (not shown) arranged on the second upper insulation layer 270 through the plurality of first bit line contact plugs BLCa. A first bit line contact plug BLCa may include tungsten, titanium, tantalum, copper, aluminum, titanium nitride, tantalum nitride, tungsten nitride, or a combination thereof.

In the connection region CON, the gate layer 130 may extend to form a pad (not shown) at an end of the gate layer 130, and a cover insulation layer 150 covering the pad portion may be disposed. In the connection region CON, the plurality of gate layers 130 may extend to have a shorter length in the first horizontal direction as the distance from the top surface of the upper substrate 110 in the vertical direction increases. In other words, the plurality of gate layers 130 in the connection region CON may have a stepped structure.

In the connection region CON, the passivation layer 170 may extend in the first horizontal direction. In the connection region CON, a second cover insulation layer SLP may be disposed on the passivation layer 170. The second cover insulation layer SLP may include the same material as the string select line cut SLC. Also, the top surface of the second cover insulation layer SLP may be at the same vertical level as the top surface of the string select line cut SLC, and the bottom surface of the second cover insulation layer SLP may be at the same vertical level as the bottom surface of the string select line cut SLC. In the connection region CON, the first upper insulation layer 250 may extend in the first horizontal direction and may be disposed on the second cover insulation layer SLP.

In the connection region CON, a contact plug CNT penetrating through the cover insulation layer 150, the passivation layer 170, the second cover insulation layer SLP, and the first upper insulation layer 250 in the vertical direction and connected to the pad of the gate layer 130 may be disposed. The contact plug CNT may include a first plug portion 160 penetrating through the cover insulation layer 150 and a second plug portion 260 penetrating through the passivation layer 170, the second cover insulation layer SLP, and the first upper insulation layer 250. The first plug portion 160 and the second plug portion 260 may each have a tapered shape in which the horizontal width thereof increases in a direction away from the top surface of the upper substrate 110.

In the connection region CON, the second upper insulation layer 270 may extend in the first horizontal direction and be disposed on the first upper insulation layer 250. A second bit line contact plug BLCb may penetrate through the second upper insulation layer 270 in the vertical direction and be connected to the contact plug CNT. The contact plug CNT may be connected to a bit line (not shown) through the second bit line contact plug BLCb.

The contact plug CNT and the second bit line contact plug BLCb may each include tungsten, titanium, tantalum, copper, aluminum, titanium nitride, tantalum nitride, tungsten nitride, or a combination thereof.

In the semiconductor device 100 according to an example embodiment, the passivation layer 170 may be formed between the gate stack GS and the string select line stack 200. The passivation layer 170 may include the first passivation layer 171 formed as a hydrogen (and/or deuterium)-rich layer and the second passivation layer 172 formed as a hydrogen (and/or deuterium)-poor layer. By forming the first passivation layer 171 as a hydrogen (and/or deuterium)-rich layer, hydrogen (and/or deuterium) may be supplied to the first channel layer 146. Therefore, cell characteristics of the semiconductor device 100 may be improved by increasing the passivation effect of the cell array structure CS.

FIGS. 6 to 11 are cross-sectional views of operations of a method of manufacturing a semiconductor device, according to an example embodiment. In detail, FIGS. 6 to 11 are cross-sectional views of respective operations of a method of manufacturing the cell array structure CS of a semiconductor device, according to an example embodiment.

Figure 6:
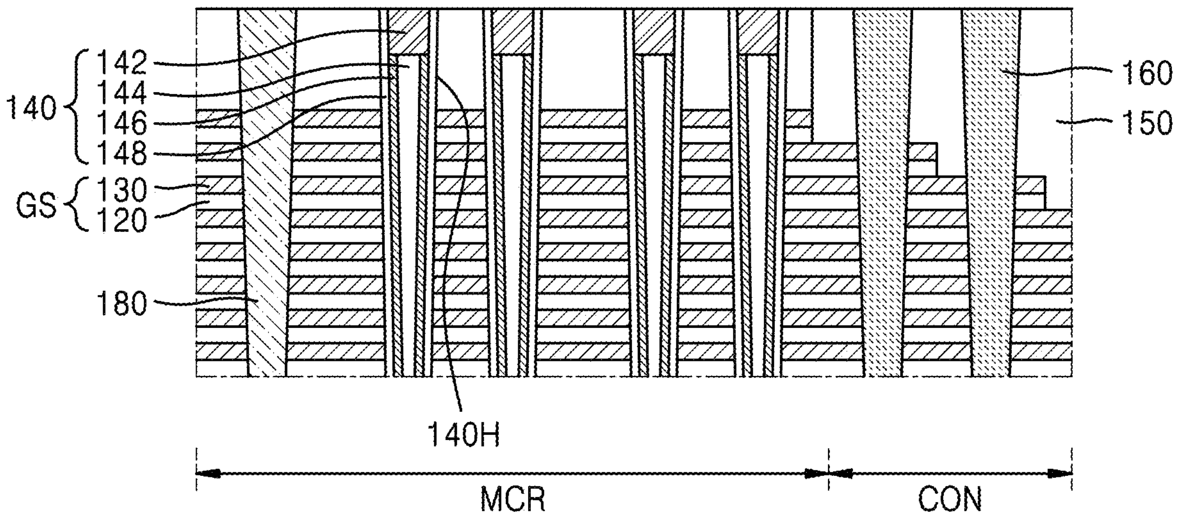
FIGS. 6 to 11 are cross-sectional views illustrating operations of a method of manufacturing a semiconductor device, according to an example embodiment.

Referring to FIG. 6, the gate stack GS including the plurality of gate layers 130 and the plurality of insulation layers 120 alternately stacked on the upper substrate 110 (refer to FIG. 4) may be formed. The gate layer 130 may be formed through a substitution process in which a mold layer (not shown) is substituted by a conductive material. Here, in the connection region CON, the plurality of gate layers 130 may extend to have a shorter length in the first horizontal direction as the distance from the top surface of the upper substrate 110 in the vertical direction increases. In other words, the plurality of gate layers 130 in the connection region CON may have a stepped structure. Also, the cover insulation layer 150 covering the gate stack GS may be formed in the connection region CON.

Next, the first channel structure 140 and the word line cut 180 penetrating through the gate stack GS may be formed. In detail, the first channel structure 140, which includes the first gate insulation layer 148, the first channel layer 146, the first filling insulation layer 144, and the first conductive plug 142, may be formed in the first channel hole 140H.

Figure 7:
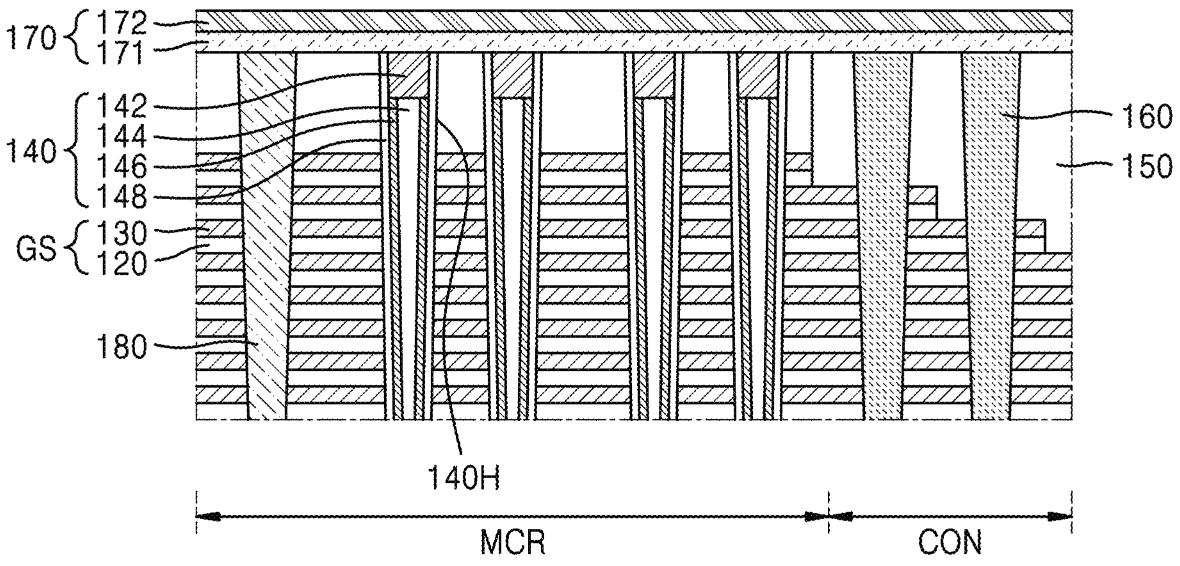

Referring to FIG. 7, in a result structure of FIG. 6, the passivation layer 170 may be formed on the gate stack GS. The passivation layer 170 may be formed through, for example, a deposition process.

In detail, the first passivation layer 171 and the second passivation layer 172 may be sequentially formed. The first passivation layer 171 may be conformally formed on the gate stack GS, and the second passivation layer 172 may be conformally formed on the first passivation layer 171.

Next, an annealing process for annealing the passivation layer 170 may be performed. At this time, the temperature of the annealing process may be from about 100° C. to about 1000° C. A passivation element may be diffused from the passivation layer 170 toward the cell array structure CS through the annealing process. In detail, a passivation element may be diffused from the first passivation layer 171 to the first channel layer 146. In this case, the passivation element may include hydrogen, deuterium, and a combination thereof, but the example embodiment is not limited thereto.

According to an example embodiment, by forming the first passivation layer 171 as a hydrogen (and/or deuterium)-rich layer, it is possible to additionally supply hydrogen (and/or deuterium) to the first channel layer 146. Also, because a process of removing the first passivation layer 171 is not included, the passivation effect may be improved without an additional process.

Figure 8:
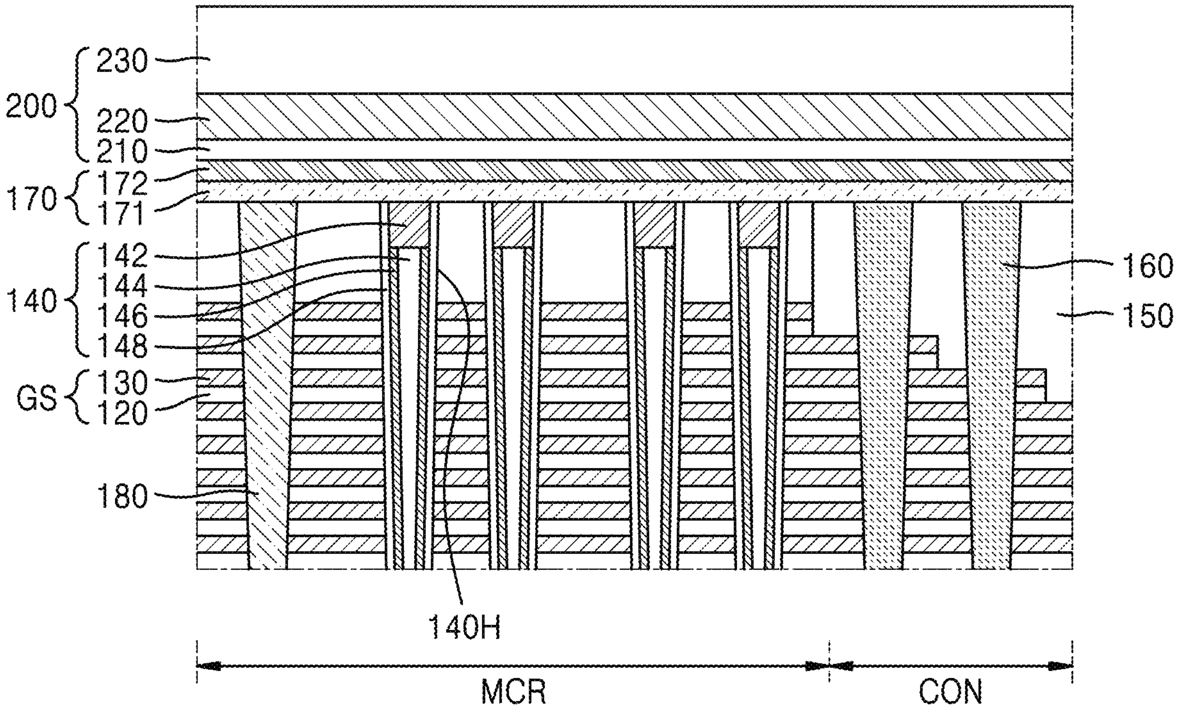

Referring to FIG. 8, in a result structure of FIG. 7, the string select line stack 200 may be formed on the passivation layer 170. In this case, the first string select line insulation layer 210, the first string select line gate layer 220, and the second string select line insulation layer 230 may be sequentially formed through a deposition process.

Figure 9:
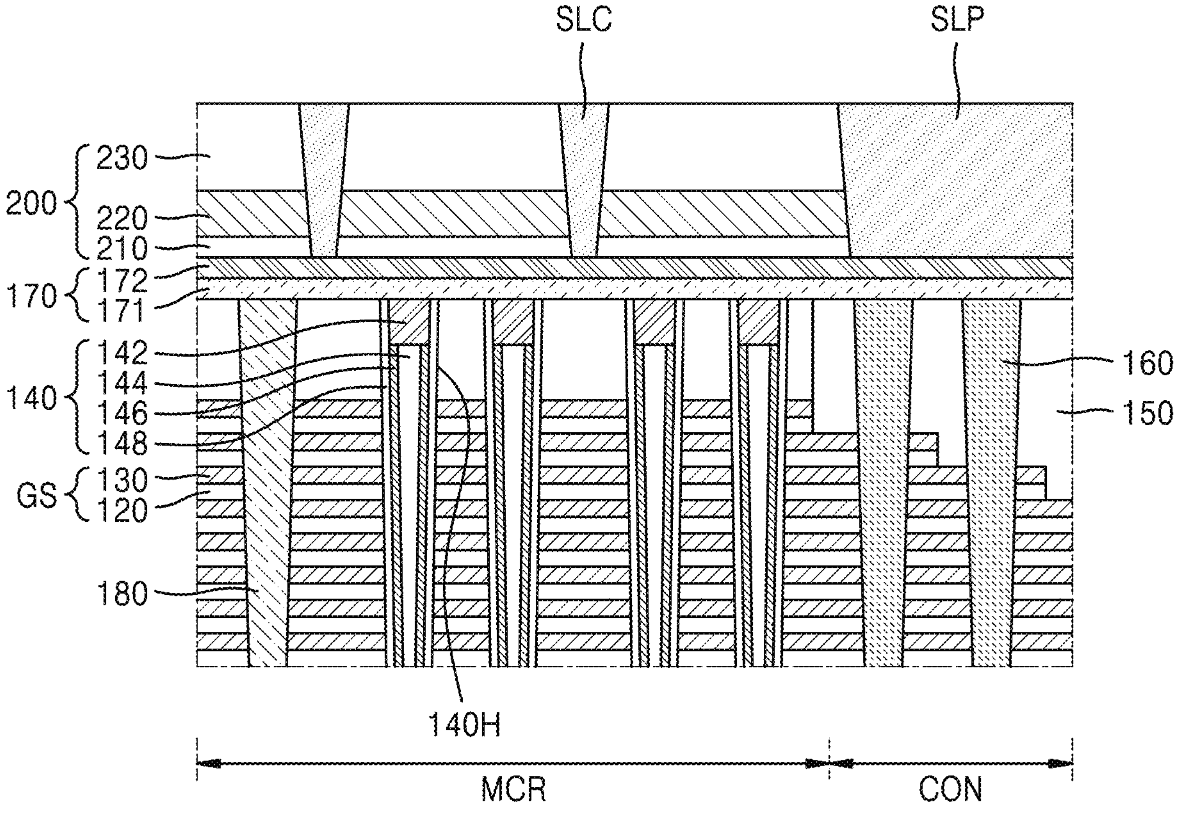

Referring to FIG. 9, in a result structure of FIG. 8, the string select line cut SLC and the second cover insulation layer SLP may be formed. In detail, a photolithography process may be performed to form a string select line cut trench (not shown) and a second cover insulation layer trench (not shown) penetrating through the string select line stack 200. The string select line cut trench SLC and the second cover insulation layer SLP may be formed by filling the string select line cut trench and the second cover insulation layer trench with an insulation material, respectively. In this case, the insulation material may include, for example, silicon oxide.

Figure 10:
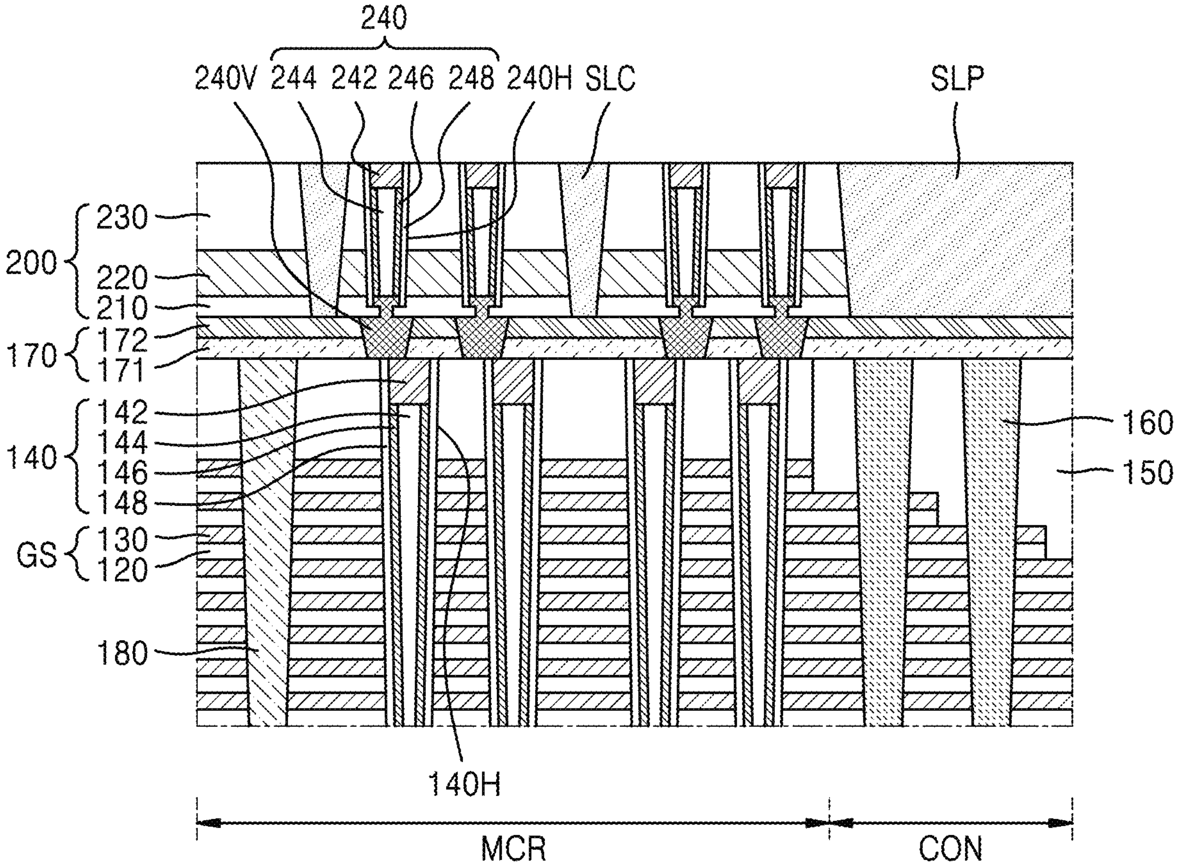

Referring to FIG. 10, in a result structure of FIG. 9, the connection via 240V and the second channel structure 240 connected to the connection via 240V may be formed. In detail, by performing a photolithography process, the connection via 240V penetrating through the passivation layer 170 may be formed and the second channel hole 240H penetrating through the string select line stack 200 may be formed. Next, the second channel structure 240 including the second gate insulation layer 248, the second channel layer 246, the second filling insulation layer 244, and the second conductive plug 242 may be formed in the second channel hole 240H.

Figure 11:
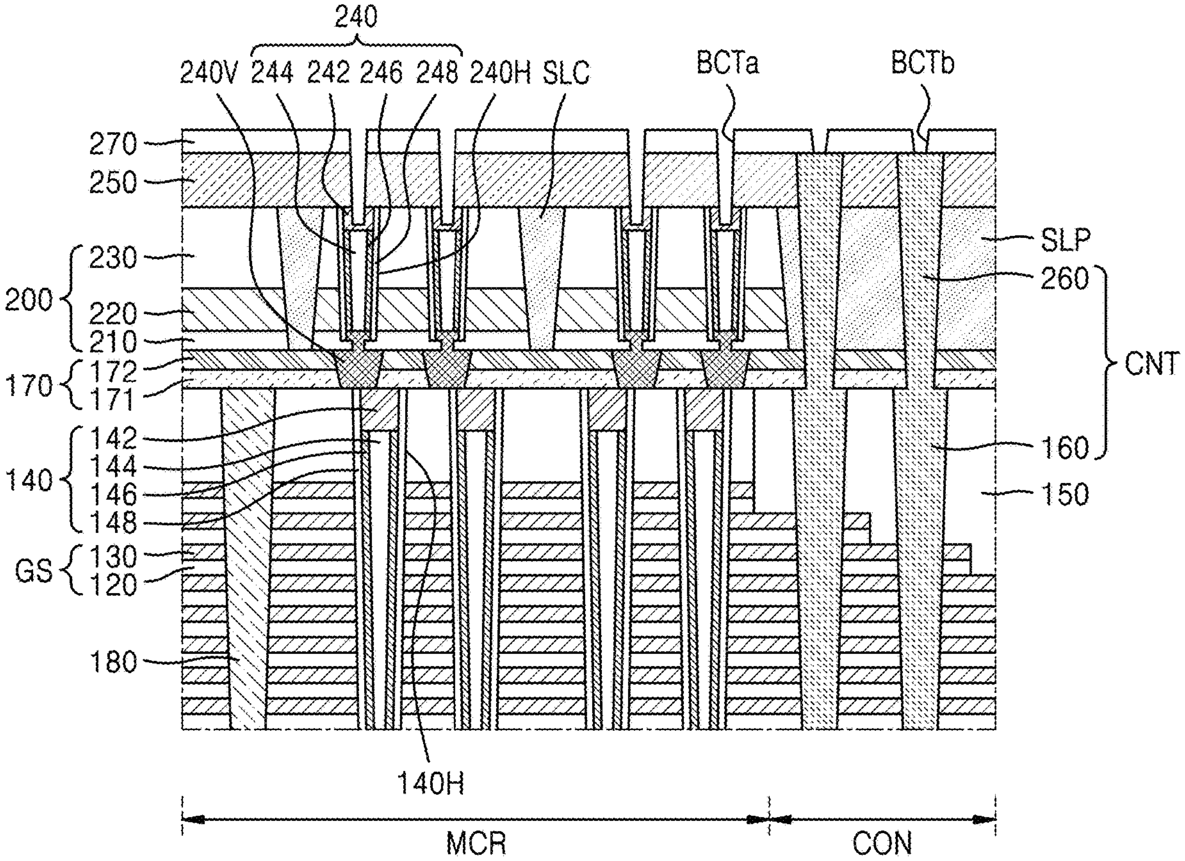

Referring to FIG. 11, the second plug portion 260 may be formed in a result structure of FIG. 10. The second plug portion 260 may be connected to the first plug portion 160 and constitute the contact plug CNT.

Next, the second upper insulation layer 270 may be formed on the first upper insulation layer 250 and the second plug portion 260, and a first bit line contact trench BCTa penetrating through a portion of the second conductive plug 242, the first upper insulation layer 250, and the second upper insulation layer 270 and a second bit line contact trench BCTb penetrating through the second upper insulation layer 270 may be formed. The first bit line contact trench BCTa may be formed to overlap the second channel structure 240 in the vertical direction, and the second bit line contact trench BCTb may be formed to overlap the contact plug CNT in the vertical direction.

Next, in a result structure of FIG. 11, the first bit line contact plug BLCa and the second bit line contact plug BLCb may be formed by filling the first bit line contact trench BCTa and the second bit line contact trench BCTb with a conductive material, thereby completing the cell array structure CS of the semiconductor device 100 shown in FIG. 4.

Figure 12:
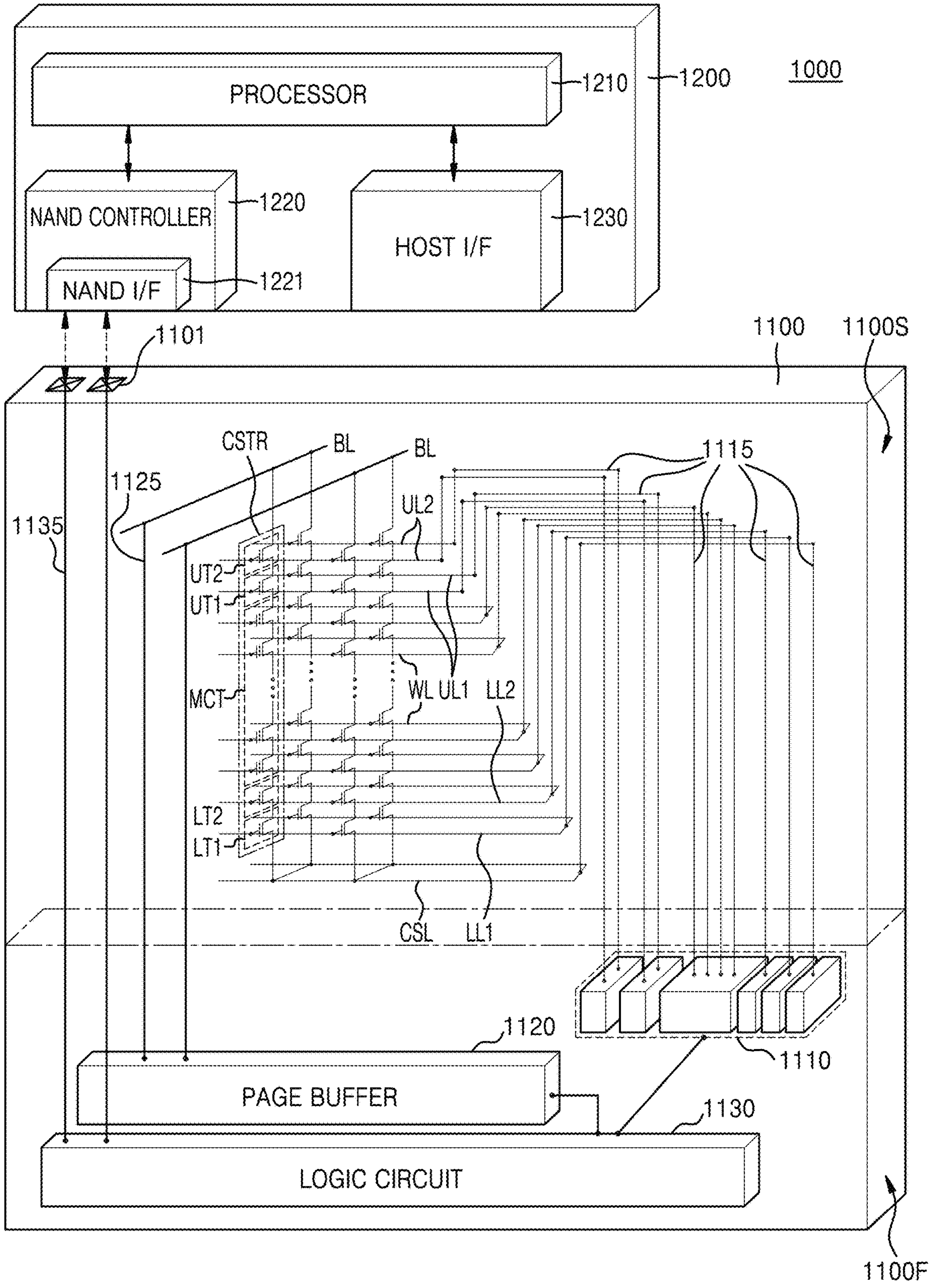
FIG. 12 is a diagram showing an electronic system including a semiconductor device, according to an example embodiment.

FIG. 12 is a diagram showing an electronic system including a semiconductor device, according to an example embodiment.

Referring to FIG. 12, an electronic system 1000 according to an example embodiment may include a semiconductor device 1100 and a controller 1200 electrically connected to the semiconductor device 1100.

The electronic system 1000 may be a storage device including one or a plurality of semiconductor devices 1100 or an electronic device including the storage device. For example, the electronic system 1000 may be a solid state drive (SSD) device, a universal serial bus (USB), a computing system, a medical device, or a communication device including at least one semiconductor device 1100.

The semiconductor device 1100 may be a non-volatile vertical memory device. For example, the semiconductor device 1100 may be a NAND flash memory device including the semiconductor device 100 described with reference to FIGS. 4 and 5. The semiconductor device 1100 may include a first structure 1100F and a second structure 1100S on the first structure 1100F. According to some example embodiments, the first structure 1100F may also be disposed next to the second structure 1100S.

The first structure 1100F may be a peripheral circuit structure including a decoder circuit 1110, a page buffer 1120, and a logic circuit 1130. The second structure 1100S may be a memory cell structure including the bit lines BL, the common source line CSL, the plurality of word lines WL, first and second gate upper lines UL1 and UL2, first and second gate lower lines LL1 and LL2, and a plurality of memory cell strings CSTR between the bit lines BL and the common source line CSL.

In the second structure 1100S, the plurality of memory cell strings CSTR may include lower transistors LT1 and LT2 adjacent to the common source line CSL, upper transistors UT1 and UT2 adjacent to the bit line BL, and a plurality of memory cell transistors MCT arranged between the lower transistors LT1 and LT2 and the upper transistors UT1 and UT2. The number of lower transistors LT1 and LT2 and the number of upper transistors UT1 and UT2 may be variously changed according to example embodiments.

According to some example embodiments, the upper transistors UT1 and UT2 may include string select transistors and the lower transistors LT1 and LT2 may include ground select transistors. The first and second gate lower lines LL1 and LL2 may be gate layers of the lower transistors LT1 and LT2, respectively. The word line WL may be a gate layer of a memory cell transistor MCT, and the first and second gate upper lines L1 and UL2 may be gate layers of the upper transistors UT1 and UT2, respectively.

The common source line CSL, the first and second gate lower lines LL1 and LL2, the plurality of word lines WL, and the first and second gate upper lines UL1 and UL2 may be electrically connected to the decoder circuit 1110 through a plurality of first connection wires 1115 extending from the inside of the first structure 1100F to the second structure 1100S. The plurality of bit lines BL may be electrically connected to the page buffer 1120 through a plurality of second connection wires 1125 extending from the inside of the first structure 1100F to the second structure 1100S.

In the first structure 1100F, the decoder circuit 1110 and the page buffer 1120 may execute a control operation on at least one of the plurality of memory cell transistors MCT. The decoder circuit 1110 and the page buffer 1120 may be controlled by the logic circuit 1130.

The semiconductor device 1100 may communicate with the controller 1200 through an input/output pad 1101 electrically connected to the logic circuit 1130. The input/output pad 1101 may be electrically connected to the logic circuit 1130 through an input/output connection wire 1135 extending from the inside of the first structure 1100F to the second structure 1100S.

The controller 1200 may include a processor 1210, a NAND controller 1220, and a host interface 1230. According to some example embodiments, the electronic system 1000 may include a plurality of semiconductor devices 1100, and, in this case, the controller 1200 may control the plurality of semiconductor devices 1100.

The processor 1210 may control the overall operation of the electronic system 1000 including the controller 1200. The processor 1210 may operate according to certain firmware and may access the semiconductor device 1100 by controlling the NAND controller 1220. The NAND controller 1220 may include a NAND interface 1221 that handles communication with the semiconductor device 1100. Control commands for controlling the semiconductor device 1100, data to be written to the memory cell transistors MCT of the semiconductor device 1100, and data to be read from the memory cell transistors MCT of the semiconductor device 1100 may be transmitted through the NAND interface 1221. The host interface 1230 may provide the function for communication between the electronic system 1000 and an external host. When a control command is received from an external host through the host interface 1230, the processor 1210 may control the semiconductor device 1100 in response to the control command.

Figure 13:
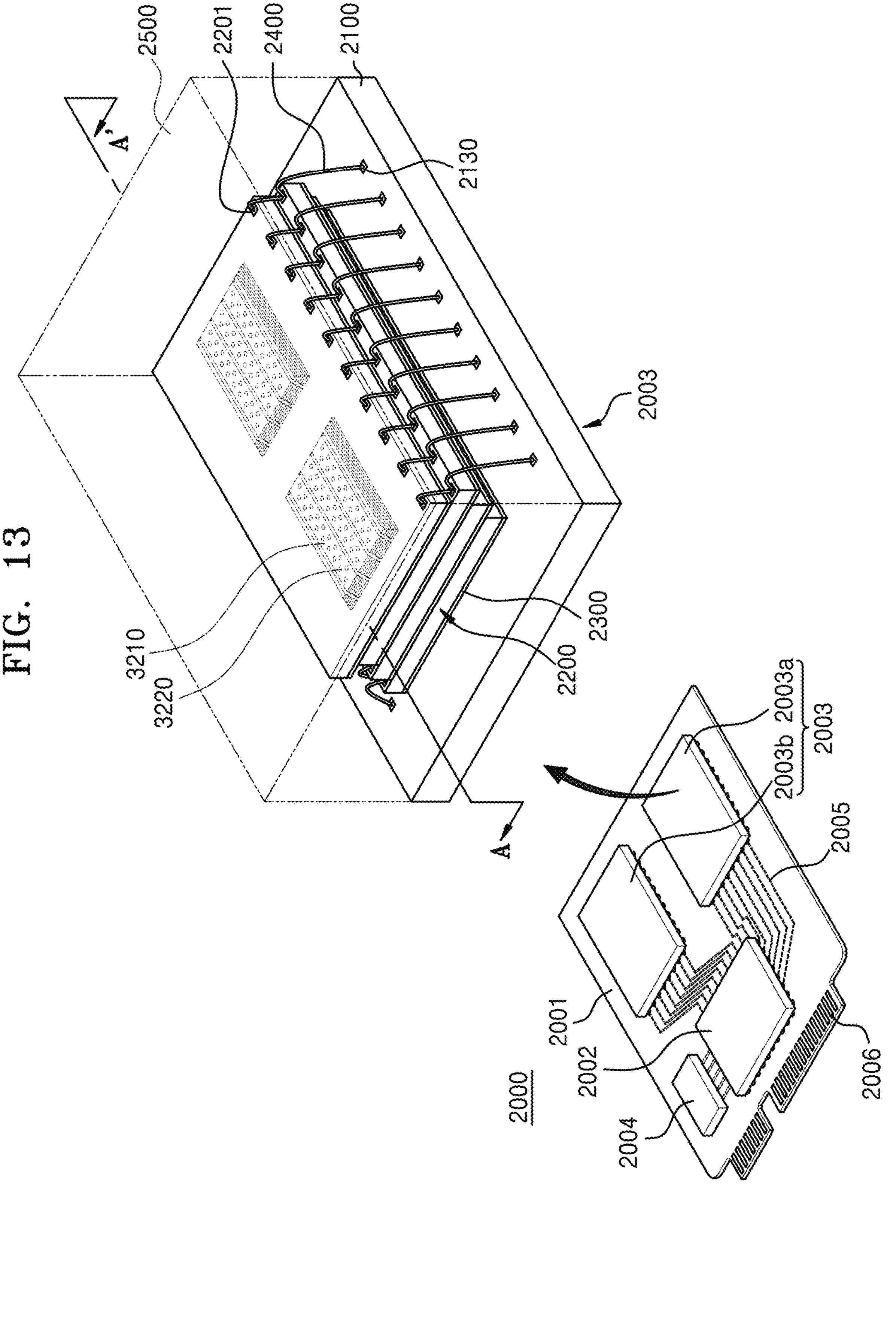
FIG. 13 is a perspective view of an electronic system including a semiconductor device, according to an example embodiment.

FIG. 13 is a perspective view of an electronic system including a semiconductor device according to an example embodiment.

Referring to FIG. 13, an electronic system 2000 according to an example embodiment may include a main substrate 2001 and a controller 2002, one or more semiconductor packages 2003, and dynamic random-access memory (DRAM) 2004 that are mounted on the main substrate 2001.

The main substrate 2001 may include a connector 2006 including a plurality of pins coupled to an external host. The number and arrangement of the pins of the connector 2006 may vary according to a communication interface between the electronic system 2000 and the external host. According to some example embodiments, the electronic system 2000 may communicate with an external host according to any one of interfaces like USB, Peripheral Component Interconnect Express (PCI-Express), Serial Advanced Technology Attachment (SATA), M-Phy for Universal Flash Storage (UFS), etc. According to some example embodiments, the electronic system 2000 may operate by power supplied from an external host through the connector 2006. The electronic system 2000 may further include a power management integrated circuit (PMIC) that distributes power supplied from the external host to the controller 2002 and the semiconductor package 2003. The semiconductor package 2003 and the DRAM 2004 may be connected to the controller 2002 by a plurality of wiring patterns 2005 formed on the main substrate 2001.

The controller 2002 may write data to or read data from the semiconductor package 2003 and may improve the operating speed of the electronic system 2000.

The DRAM 2004 may be a buffer memory for mitigating a speed difference between the semiconductor package 2003, which is a data storage space, and an external host. The DRAM 2004 included in the electronic system 2000 may also operate as a type of cache memory and may provide a space for temporarily storing data in a control operation for the semiconductor package 2003. When the DRAM 2004 is included in the electronic system 2000, the controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. The first and second semiconductor packages 2003*a* and 2003*b* may each be a semiconductor package including a plurality of semiconductor chips 2200. The first and second semiconductor packages 2003*a* and 2003*b* may each include a package substrate 2100, the semiconductor chips 2200 on the package substrate 2100, an adhesive layer 2300 disposed on the bottom surface of each of the semiconductor chips 2200, a connection structure 2400 electrically connecting the semiconductor chips 2200 and the package substrate 2100, and a molding layer 2500 covering the semiconductor chips 2200 and the connection structure 2400 on the package substrate 2100.

The package substrate 2100 may be a printed circuit board including a plurality of package upper pads 2130. The semiconductor chips 2200 may each include an input/output pad 2201. The input/output pad 2201 may correspond to the input/output pad 1101 of FIG. 12. The plurality of semiconductor chips 2200 may each include a plurality of gate stacks 3210 and a plurality of channel structures 3220. The plurality of semiconductor chips 2200 may include the semiconductor device 100 described with reference to FIGS. 4 and 5.

According to example embodiments, the connection structure 2400 may be a bonding wire electrically connecting the input/output pad 2201 and the package upper pad 2130. Therefore, in the first and second semiconductor packages 2003*a* and 2003*b*, the semiconductor chips 2200 may be electrically connected to one another through bonding wires and may be electrically connected to the package upper pads 2130 of the package substrate 2100. According to some example embodiments, in the first and second semiconductor packages 2003*a* and 2003*b*, the semiconductor chips 2200 may be connected to one another through a connection structure including through silicon vias (TSVs) instead of the connection structure 2400 including bonding wires.

According to some example embodiments, the memory controller 2002 and the semiconductor chips 2200 may be included in one package. According to some example embodiment, the controller 2002 and the semiconductor chips 2200 may be mounted on a separate interposer substrate different from the main substrate 2001 and the controller 2002 and the semiconductor chips 2200 may be connected to each other through wires formed on the interposer substrate.

Figure 14:
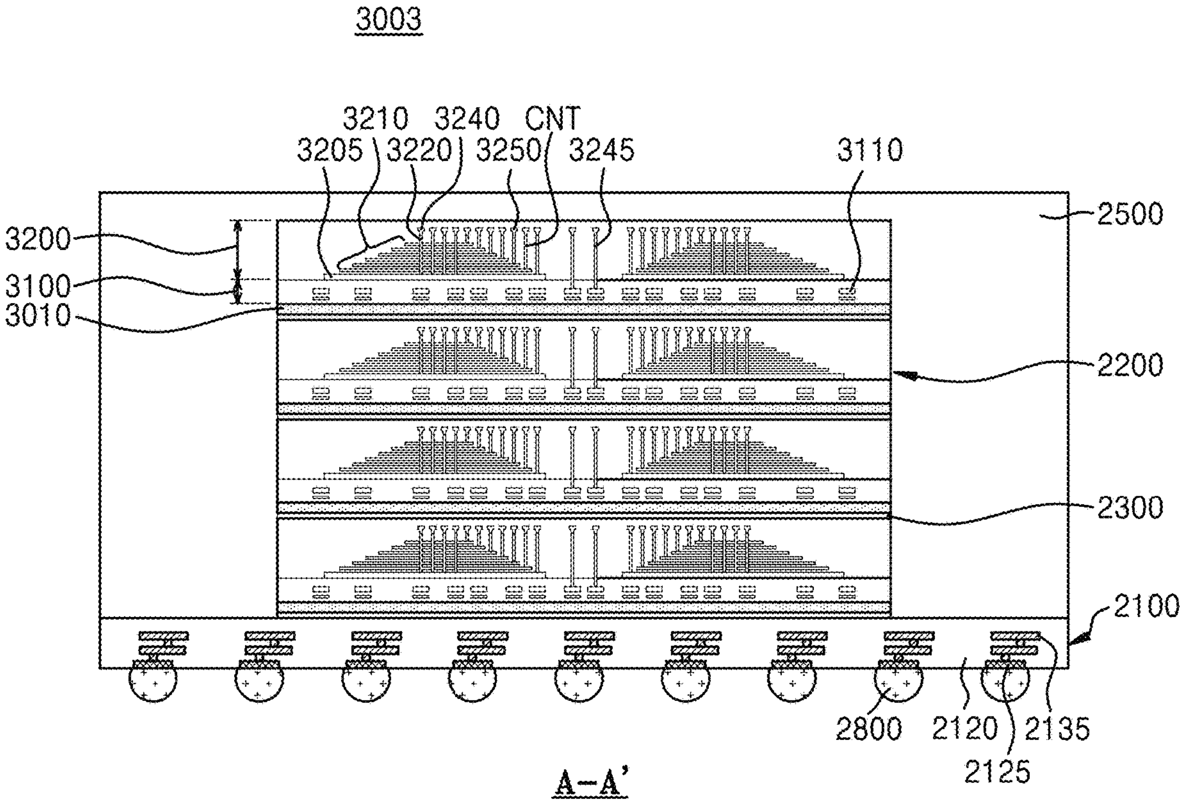
FIG. 14 is a cross-sectional view of a semiconductor package including a semiconductor device, according to an example embodiment.

FIG. 14 is a cross-sectional view of a semiconductor package including a semiconductor device, according to an example embodiment.

In detail, FIG. 14 is a detailed cross-sectional view taken along a line A-A' of FIG. 13.

Referring to FIG. 14, in a semiconductor package 3003, the package substrate 2100 may be a printed circuit board.

The package substrate 2100 may include a body 2120, a plurality of upper pads 2130 (refer to FIG. 13) arranged on the top surface of the body 2120, and a plurality of lower pads 2125 arranged or exposed on the bottom surface of the body 2120, and a plurality of internal wires 2135 electrically interconnecting the plurality of upper pads 2130 and the plurality of lower pads 2125 inside the body 2120. The plurality of upper pads 2130 may be electrically connected to a plurality of connection structures 2400 (refer to FIG. 13). The plurality of lower pads 2125 may be connected to the plurality of wiring patterns 2005 on the main substrate 2001 of the memory system 2000 shown in FIG. 13 through a plurality of conductive connections 2800.

The plurality of semiconductor chips 2200 may each include a semiconductor substrate 3010 and a first structure 3100 and a second structure 3200 sequentially stacked on the semiconductor substrate 3010. The first structure 3100 may include a peripheral circuit region including a plurality of peripheral wires 3110. The second structure 3200 may include a common source line 3205, a gate stack 3210 on the common source line 3205, a channel structure 3220 penetrating through the gate stack 3210, and a bit line 3240 electrically connected to the channel structure 3220.

The plurality of semiconductor chips 2200 may each include a through wire 3245 electrically connected to the plurality of peripheral wires 3110 of the first structure 3100 and extending into the second structure 3200. The through wire 3245 may be disposed outside the gate stack 3210. According to other example embodiments, the semiconductor package 3003 may further include a through wire penetrating through the gate stack 3210. The plurality of semiconductor chips 2200 may each further include the input/output pad 2201 (refer to FIG. 8) electrically connected to the plurality of peripheral wires 3110 of the first structure 3100.

While the example embodiment has been particularly shown and described with reference to example embodiments thereof, it will be understood that various changes in form and details may be made therein without departing from the spirit and scope of the following claims.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in the same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

When either of the terms "about" or "substantially" is used in this specification in connection with a numerical value, it is intended that the associated numerical value includes a manufacturing or operational tolerance (e.g., ±10%) around the stated numerical value. Moreover, when the word "generally" or "substantially" is used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

As used herein, expressions such as "at least one of," when preceding a list of elements, modify the entire list of elements and do not modify the individual elements of the list. Thus, for example, both "at least one of A, B, or C" and "at least one of A, B, and C" mean either A, B, C or any combination of two or more of A, B, and C. Likewise, A and/or B means A, B, or A and B.

What is claimed is:

1. A semiconductor device comprising:
- a semiconductor substrate;
- a gate stack comprising a plurality of gate layers and a plurality of insulation layers alternately stacked on the semiconductor substrate;
- a plurality of first channel structures penetrating through the gate stack and extending in a vertical direction;
- a word line cut penetrating through the gate stack and extending in the vertical direction;
- a passivation layer disposed on the gate stack; and
- a string select line stack disposed on the passivation layer,
- wherein the passivation layer comprises a first passivation layer containing a passivation element and a second passivation layer having a smaller content of the passivation element than the first passivation layer.

2. The semiconductor device of claim 1, wherein the passivation element comprises at least one element of hydrogen or deuterium.

3. The semiconductor device of claim 1, wherein
- the first passivation layer is disposed on the gate stack in a horizontal direction, and
- the second passivation layer is stacked on the first passivation layer in the horizontal direction.

4. The semiconductor device of claim 1, wherein a thickness of the first passivation layer in the vertical direction is greater than or equal to the thickness of the second passivation layer in the vertical direction.

5. The semiconductor device of claim 1, wherein the first passivation layer and the second passivation layer comprise silicon nitride layers.

6. The semiconductor device of claim 1, wherein a first channel structure of the plurality of first channel structures comprises:
- a first channel hole;
- a first gate insulation layer and a first channel layer sequentially arranged on a sidewall of the first channel hole;
- a first filling insulation layer filling a remaining space of the first channel hole; and
- a first conductive plug blocking an entrance of the first channel hole.

7. The semiconductor device of claim 1, further comprising:
- a plurality of second channel structures penetrating through the string select line stack and extending in the vertical direction; and
- connection vias configured to electrically interconnect the plurality of first channel structures and the plurality of second channel structures.

8. The semiconductor device of claim 7, wherein a central axis of a first channel structure of the plurality of first channel structures and a central axis of a corresponding second channel structure of the plurality of second channel structures are offset from each other.

9. The semiconductor device of claim 7, wherein a second channel structure of the plurality of second channel structures comprises:
- a second channel hole;
- a second gate insulation layer and a second channel layer sequentially arranged on a sidewall of the second channel hole;
- a second filling insulation layer filling a remaining space of the second channel hole; and
- a second conductive plug blocking an entrance of the second channel hole.

10. The semiconductor device of claim 1, further comprising a string select line cut penetrating through the string select line stack and extending in the vertical direction.

11. The semiconductor device of claim 7, further comprising:
- an upper insulation layer disposed on the string select line stack; and
- a bit line contact plug penetrating through the upper insulation layer in the vertical direction and connected to a second channel structure of the plurality of second channel structures.

12. A semiconductor device comprising:
- a semiconductor substrate;
- a gate stack comprising a plurality of gate layers and a plurality of insulation layers alternately stacked on the semiconductor substrate;
- a plurality of first channel structures penetrating through the gate stack and extending in a vertical direction;
- a word line cut penetrating through the gate stack and extending in the vertical direction;
- a passivation layer disposed on the gate stack;
- a string select line stack disposed on the passivation layer;
- a plurality of second channel structures penetrating through the string select line stack and extending in the vertical direction; and
- connection vias configured to electrically interconnect the plurality of first channel structures and the plurality of second channel structures,
- wherein the passivation layer comprises a first passivation layer containing a passivation element including at least one element of hydrogen or deuterium and a second passivation layer having a smaller content of the passivation element than the first passivation layer.

13. The semiconductor device of claim 12, wherein
- the first passivation layer is disposed on the gate stack in a horizontal direction, and
- the second passivation layer is stacked on the first passivation layer in the horizontal direction.

14. The semiconductor device of claim 12, wherein a thickness of the first passivation layer in the vertical direction is greater than or equal to the thickness of the second passivation layer in the vertical direction.

15. The semiconductor device of claim 12, wherein the first passivation layer and the second passivation layer comprise silicon nitride layers.

16. The semiconductor device of claim 12, wherein a central axis of a first channel structure of the plurality of first channel structures and a central axis of a corresponding second channel structure of the plurality of second channel structures are offset from each other.

17. An electronic system comprising:
a main substrate;
a semiconductor device on the main substrate; and
a controller electrically connected to the semiconductor device on the main substrate, wherein the semiconductor device comprises:
a semiconductor substrate;
a gate stack comprising a plurality of gate layers and a plurality of insulation layers alternately stacked on the semiconductor substrate;
a plurality of first channel structures penetrating through the gate stack and extending in a vertical direction;
a word line cut penetrating through the gate stack and extending in the vertical direction;
a passivation layer disposed on the gate stack;
a string select line stack disposed on the passivation layer; and
a plurality of second channel structures penetrating through the string select line stack, extending in the vertical direction, and arranged so that a second channel structure of the plurality of second channel structures is offset from a corresponding first channel structure of the plurality of first channel structures, and
the passivation layer comprises a first passivation layer containing a passivation element including at least one element of hydrogen or deuterium and a second passivation layer having a smaller content of the passivation element than the first passivation layer.

18. The electronic system of claim 17, wherein
the first passivation layer is disposed on the gate stack in a horizontal direction, and the second passivation layer is stacked on the first passivation layer in the horizontal direction.

19. The electronic system of claim 17, wherein a thickness of the first passivation layer in the vertical direction is greater than or equal to the thickness of the second passivation layer in the vertical direction.

20. The electronic system of claim 17, wherein the first passivation layer and the second passivation layer comprise silicon nitride layers.

* * * * *